United States Patent [19]

Takeuchi et al.

[11] Patent Number: 5,460,708
[45] Date of Patent: Oct. 24, 1995

[54] SEMICONDUCTOR PROCESSING SYSTEM

[75] Inventors: Yoshiji Takeuchi, Urawa; Nobuyuki Takahashi, Koshigaya, both of Japan

[73] Assignee: Texas Instruments Incorporated, Dallas, Tex.

[21] Appl. No.: 798,394

[22] Filed: Nov. 26, 1991

[30] Foreign Application Priority Data

Nov. 30, 1990 [JP] Japan ................... 2-339125

[51] Int. Cl.$^6$ ................................. C23C 14/34
[52] U.S. Cl. .............. 204/298.11; 204/298.23; 204/298.26; 204/298.28
[58] Field of Search ............ 204/192.2, 298.11, 204/298.15, 298.25, 298.26, 298.28, 298.23

[56] References Cited

U.S. PATENT DOCUMENTS

| 4,410,407 | 10/1983 | Macaulay | 204/298.11 X |
| 4,416,759 | 11/1983 | Harra et al. | 204/298.11 |
| 4,548,699 | 10/1985 | Hutchinson et al. | 204/298.25 |
| 4,756,815 | 7/1988 | Turner et al. | 204/298.25 |
| 4,820,106 | 4/1989 | Walde et al. | 204/298.25 X |
| 4,987,172 | 1/1990 | Katsura et al. | 204/298.11 X |
| 5,112,467 | 5/1992 | Zejda | 204/298.11 X |

FOREIGN PATENT DOCUMENTS

| 0135567 | 7/1985 | Japan | 204/298.11 |
| 0026359 | 2/1988 | Japan | 204/298.11 |
| 0103068 | 5/1988 | Japan | 204/298.11 |
| 0282261 | 11/1988 | Japan | 204/298.11 |

*Primary Examiner*—Nam Nguyen
*Attorney, Agent, or Firm*—William E. Hiller; Richard L. Donaldson

[57] ABSTRACT

Semiconductor processing system for forming a conductive metal film on a semiconductor wafer surface by a sputtering technique, wherein the metal film is to be subsequently patterned into a wiring pattern. The semiconductor processing system includes a support structure for the semiconductor wafer, a fastening device for securing the support structure, and a shielding member which shields the greater part of the area of the support structure and the fastening device for preventing the metal particles being sputtered onto the semiconductor wafer surface from adhering to areas other than the semiconductor wafer surface. The shielding member which may be a shielding plate includes an integral supplementary shielding member in the form of a cylindrical shield defining its system periphery to protect other areas of processing system components from the sputtered metal particles. This system substantially reduces the incidence of metal particles separating from outside unshielded areas of processing system components and thereafter adhering to the semiconductor wafer as the semiconductor wafer is being moved during different stages of the sputtering process which would otherwise result in the contamination of the patterned wiring pattern by such separated metal particles causing defects therein.

4 Claims, 12 Drawing Sheets

SEMICONDUCTOR PROCESSING SYSTEM

FIELD OF THE INVENTION

The present invention relates to a semiconductor processing system, and relates, for example, to a semiconductor processing system to be used in forming the desired coating on the surface of a semiconductor.

PRIOR ART

Procedures for manufacturing electronic devices such as integrated circuit devices include a procedure for forming a conductive metal thin film (such as an aluminum thin film) for wiring on the surface of a semiconductor wafer (referred to below simply as "wafer"). This thin film is generally formed by sputtering. Wafers are thin discs which are cut out of ingots of silicon or gallium arsenic monocrystals, and come in a variety of sizes, with diameters of 4–8 inches. An aluminum thin film is patterned into the desired fine wiring pattern by the photolithography method in the following procedure.

The processing member of the sputtering system appears in a cylindrical shape, the space inside of which is divided into the following five areas: an entrance and exit area for inputting and exiting the wafer; a preheating area for preheating the wafer; a first sputtering area; a second sputtering area; and a third sputtering area. The wafer is mounted in the processing area through the entrance and exit area, after which it is intermittently shifted 72 degrees in the circumferential direction to perform the processing in each of the aforementioned areas, after which it is removed from the processing area through the entrance and exit area.

FIGS. 17 and 18 are enlarged schematic views through the center of the processing area from the entrance and exit area and three sputtering areas (enlarged schematic cross sections of the line A—A in FIG. 15, which is an oblique view of the processing area to be described below). FIG. 17 shows the status of sputtering treatment in process, while FIG. 18 shows wafer being moved from the third sputtering area to the entrance and exit area, respectively.

A cylindrical shaft (3), which is attached to be freely rotating on the outside of a stationary shaft (2), passes through the center of one side wall (5) of a processing area (1), and a transfer plate (12) is fastened onto a flange (3a) on the tip of the cylindrical shaft (3). The cylindrical shaft (3) is attached between the stationary shaft (2) and the sleeve (5a) of the side wall (5) in a manner called the "double O ring seal", to be airtight and freely rotating. In the figures, OR is the O ring. The transfer plate (12) contains a round through-hole (12a) with a diameter slightly larger than that of the wafer W (a diameter of 124 mm with respect to the 4.5 inch wafer). Linear clips (15) are attached via a clip support (13) to a number of locations (four locations in the present example) near the through-hole (12a) of the transfer plate (12). The wafer W is designed to be supported on the tips of the clips (15). The clip support (13) and the area of the transfer plate (12) area near the clip support (13) are covered by a clip cover (14). A pressure plate (16) is attached to the flange (2a) of the stationary plate (2) so that it is piled on the transfer plate (12), and so that it can be moved to the center line CL of the cylindrical shaft (3). This pressure plate (16) is situated so that it can be pressed against or separated from the transfer plate (12). FIG. 17 shows the pressure plate (16) pressing against the transfer plate (12). In this state, the wafer in the sputter treatment and entrance and exit areas is inserted and removed from a sputter area (1e). A pressure plate shield (50), and a donut-shaped shielding plate (called a cavity) (17E), which contains through-holes (17a) made in four locations (with 4.5 inch specifications), are screwed onto the pressure plate (16). The shielding plate (17E), clip cover (14), and pressure plate shield (50) are installed to prevent the coating material particles (aluminum particles in the present example) during sputtering from adhering to the pressure plate (16), transfer plate (12) and clip support (13).

In the sputtering area (1e), a target support case (9) is attached to the side wall (7) opposite the side wall (5) to be airtight in the through-hole (7a) which faces the wafer W, and an aluminum target (20) is placed inside it. A heater (18), which contains argon gas through-holes (18a), is attached to the side wall (5) near the wafer W. Argon gas is allowed to flow through a pipe (19) and the through-holes (18a) to reach the sputtering area (1e). The through-holes (7a) of the side wall (7) are designed to be covered by a shutter (22) (shown by an imaginary line) which is freely rotating about a shaft (21). When sputtering is not being carried out, i.e., when the wafer is being moved, the shutter (22) is positioned on the imaginary line (situated on the solid line in FIG. 18) to prevent the aluminum particles from being floated. The wafer W inside the third sputtering area (1e) is preheated in the preheating area (1b) shown in FIG. 15, after which it is moved and sputtered in the first and second sputtering areas (1c) and (1d) by rotating the cylindrical shaft (3) 72 degrees. The first and second sputtering areas (1c) and (1d) are structured in the same manner as the third sputtering area (1e).

A first cylinder (57) and second cylinder (54) are attached to the side wall (7) of the processing area (1). The stationary shaft (2) and cylindrical shaft (3) are pressed in the direction of the arrow by a pressing mechanism which is not shown. Next, a pressure plate (56), which is fitted into the first cylinder (57), passes through the through-hole (50C) of a pressure plate (50), allowing the tip of the pressure plate (56) to make contact with the tip of the stationary shaft (2), thereby fastening the pressure plate (16). A load/lock plate (52) is fastened on the tip of a load/lock ram (53), which is fitted into a second cylinder (54). When the load/lock ram (53) is pushed in the direction of the arrow, the transfer plate (12) is sandwiched using the O ring OR between an O ring support (51), which is attached to the side wall (5), and the load/lock plate (52), thereby positioning it to be airtight. In addition, a wafer exchange chamber (1f) is formed at this time by the O ring OR and the load/lock plate (52), which moves at roughly the same time as the pressure plate (56) in the same direction.

Sputtering is carried out in the following manner. First, an exhaust pump (61), which is connected to an exhaust pipe (59), is driven to depressurize the inside of the processing area (1) to the order of $10^{-7}$ torr. In the figures, (60) is a vacuum blocking valve. Next, immediately prior to the start of sputtering, argon gas passes from the pipe (19) through the through-hole (18a) into the processing area (1). Next, while the argon gas is flowing, direct current voltage is applied to a target (20) between a cathode, and an anode (neither electrode is shown) which is situated inside the through-hole (20a) of the target (20), thereby forming an electric field to generate plasma discharge near the surface of the target (20). Next, the surface of the target (20) is sputtered by the argon ions thus generated, thereby releasing aluminum atoms D, which are floated in the direction of the wafer W. It should be noted that at this time, the pressure plate (16) presses against the transfer plate (12), which maintains the wafer W in close contact with the heater (18). The floated aluminum atoms D are adhered to the surface of the wafer W as aluminum particles $D_1$, which are deposited to form a thin film of aluminum on the wafer. The argon atmosphere inside the processing area (1) at this time is at a pressure in the range of $10^{-2}$ to $10^{-3}$ torr.

When the processing in the third sputtering area (1e) is finished, then as shown in FIG. 18, a first cylinder driver (58) is driven to retract the pressure plate ram (56) as shown by the arrow. At roughly the same time, a second cylinder driver (55) is driven to retract the load/lock ram (53) as shown by the arrow. Next, the transfer plate (12) and pressure plate (16) are moved as shown by the arrows by the aforementioned pressing mechanism, so that the transfer plate (12) is separated from the O ring support (51) and load/lock plate (52), and is sufficiently separated from the heater (18) to be in a position where it is freely rotating. Next, when the cylindrical shaft (3) is rotated exactly 72 degrees in the direction of the arrow, only the area of the wafer W which has been treated will face the through-holes (5b) of the side wall (5). Next, the first and second cylinder drivers (58) and (55) are again driven to return to the situation shown in FIG. 17. Next, a shield door (39) is opened to open the through-holes (5b), thereby allowing the treated wafer W to be removed as shown by the imaginary line through a load/lock door (38). This will be explained in detail below using FIG. 16.

The order of procedure opposite that described above is followed to input the unprocessed wafer in the processing area (1). Next, the input and unprocessed wafer is moved from the entrance and exit area (1a) in the situation shown in FIG. 18 to the preheating area (1b) shown in FIG. 15.

During the aforementioned sputtering, part of the aluminum atoms D adhere to the wafer W and shielding plate (17E) as aluminum particles $D_1$ and $D_2$. However, part of the aluminum atoms D which pass through the through-holes (17a) of the shielding plate (17E) circulate near the pressure plate (16), adhering to the clip cover (14) as aluminum particles $D_3$, to the pressure plate (16) as aluminum particles $D_4$, to a surface facing the pressure plate (16) and transfer plate (12) and slightly separated from them as aluminum particles $D_5$, and to the clip (15) as aluminum particles $D_6$. In other words, the shielding plate (17E) does not completely shield the floated aluminum particles. The aluminum particles $D_3$, $D_4$, and $D_5$, which thus adhere to the outside areas of the wafer and shielding plate, can easily separate from the surfaces to which they adhere during the movement of the wafer from the first sputtering area (1c) to the second sputtering area (1d), during the movement of the wafer from the second sputtering area (1d) to the third sputtering area (1e), and during the movement of the wafer from the third sputtering area (1e) to the entrance and exit area (1a). When these separated aluminum particles adhere to the wafer, the normal deposition of aluminum particles $D_1$ in such adhering locations is obstructed, or the normal patterning is obstructed, so that after the following wiring pattern has been produced, definite defects, such as cuts and short-circuits in the wiring, occur. In addition, since these defects are discovered after the aluminum thin film patterning, the number of processing necessary for such defective products is increased, which is extremely undesirable.

The present invention has as an object the provision of a processing system used in the manufacture of a semiconductor device wherein the processing system includes shielding means for preventing the undesired adherence of coating formation material particles to areas other than a semiconductor wafer or substrate when the coating formation material particles are deposited onto a surface of the semiconductor wafer to form a coating on the semiconductor.

SUMMARY OF THE INVENTION

The present invention relates to a semiconductor processing system in which particles of a coating formation material are deposited onto a surface of a semiconductor wafer to form a coating thereon;

wherein said semiconductor processing system comprises: a supporting means for supporting said semiconductor wafer, a fastening means for fastening this supporting means, and a shielding means (such as a shielding plate 17A, to be described below) for shielding, from said coating formation material particles, at least the greater part of the area consisting of said supporting means and said fastening means, wherein said shielding means comprises a shielding supplementary member (such as a cylindrical member 17b, to be described below), which is used to shield, from said coating formation material particles, areas other than the greater part of the area consisting of either said supporting means or said fastening means, or consisting of both of them.

DETAILED DESCRIPTION OF THE PREFERRED EMBODIMENTS

Embodiments of the present invention will be explained below.

First, a summary of the sputtering system will be described.

Figure 14:
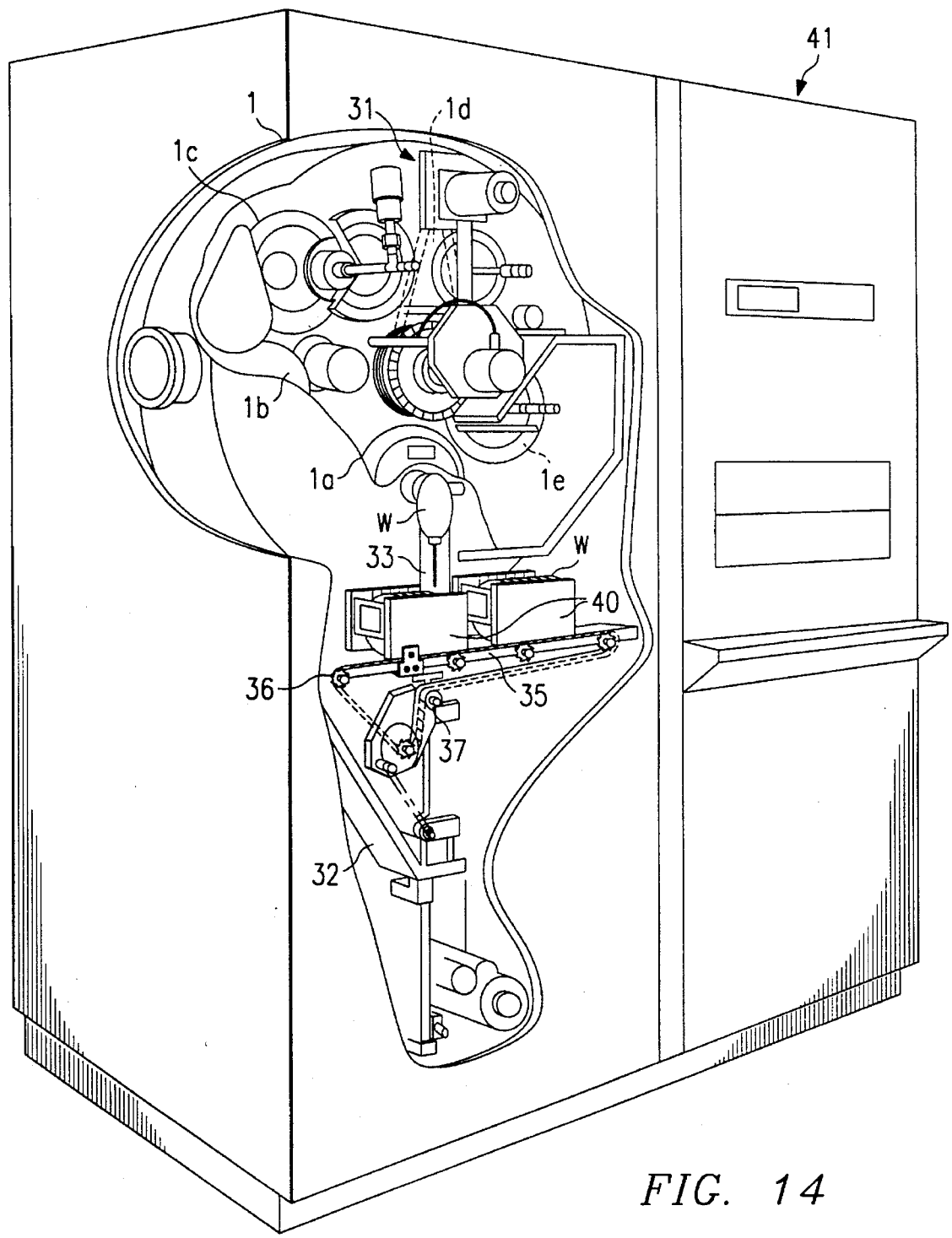
FIG. 14 is a partially cut-away perspective view of a sputtering system.

FIG. 14 is a cutaway oblique diagram of a sputtering system.

The sputtering system comprises a processing area (1), a first driver (31) for driving operations inside said processing area (1), a second driver (32) for transferring the wafer, and an operating member (41).

Figure 15:
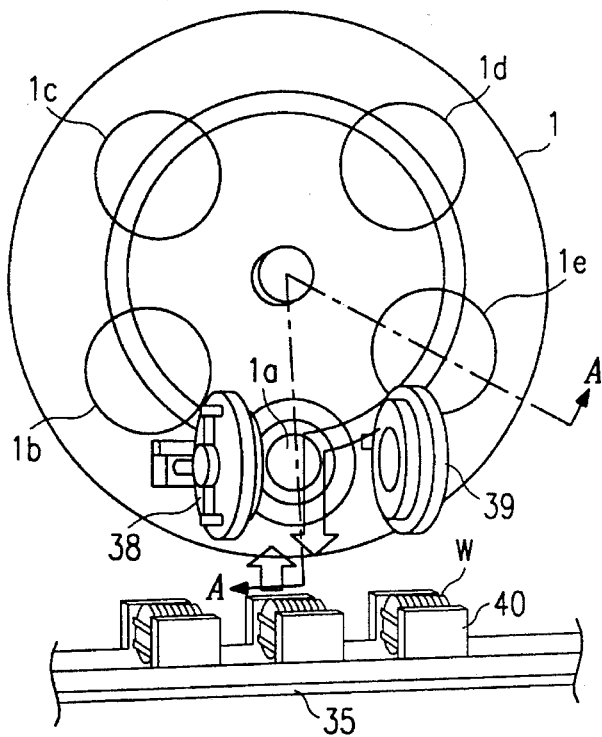
FIG. 15 is a fragmentary perspective view of the treatment area in the sputtering system of FIG. 14, showing cassettes of semiconductor wafers which are to receive a sputtering treatment.

As shown in FIG. 15, the inside of the processing area (1) consists of equidistant divisions (there are no partitions) in the circumferential direction of five areas: the entrance and exit area (1a), preheating area (1b), first sputtering area (1c), second sputtering area (1d), and third sputtering area (1e). The wafer W, which is contained in a cassette (40), is guided by a guide (35) as it is moved to the front and bottom of the entrance and exit area (1a), where it is intermittently moved in the direction of the arrow to carry out the sputtering operations, after which it is moved back to be stored in the cassette (40) again.

Figure 16:
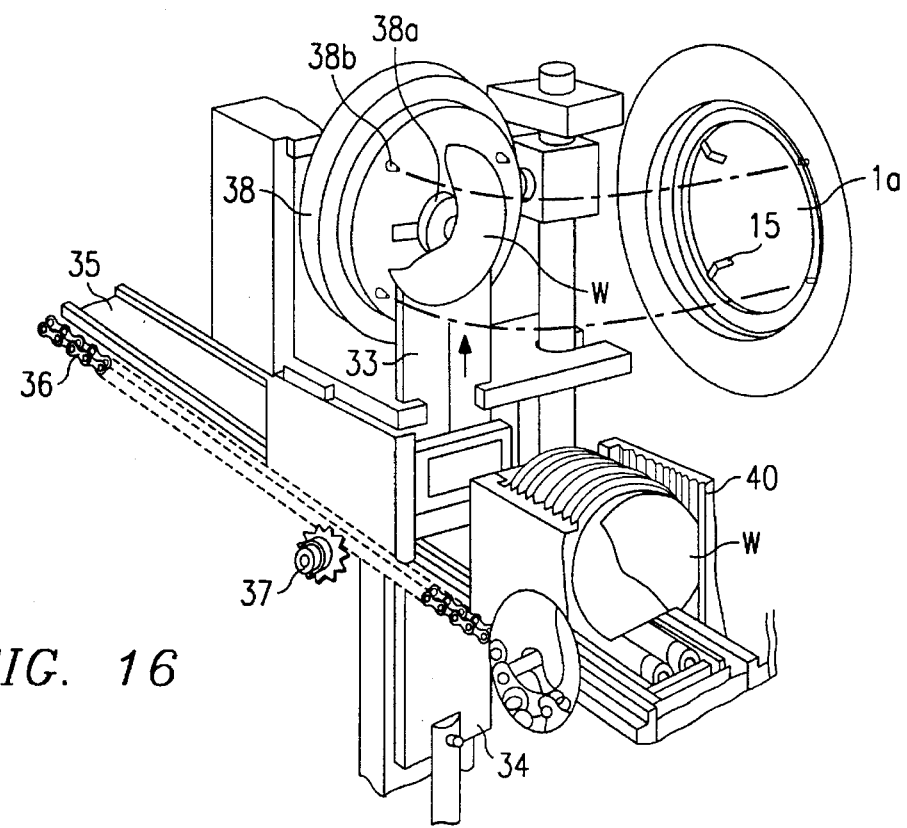
FIG. 16 is a fragmentary perspective view showing the entrance and exit mechanism of the sputtering system of FIG. 14 for introducing respective semiconductor wafers to a sputtering treatment.

FIG. 16 is an oblique view of the major areas involved in handling the wafer in the processing area.

The cassette (40), in which the wafer W is stored, is attached to a chain (36) which turns on a sprocket (37), and is designed to be moved while being guided by the guide (35). After the shield door (39) is opened, the wafer W is raised by a lifter (33), which can move up and down through the guide (35), and is then attached to an attachment pickup (38a), which is attached to the load door (38) of the entrance and exit area (1a). After the lifter (33) is lowered, the load door (38) closes, thereby allowing the wafer W to be supported on the clips (15) situated in the entrance and exit area (1a). In supporting the wafer, the tips of the clips (15) are bent by pins (38b), which are situated on the load door (38), thereby supporting the wafer W. Next, after the load door (38) opens, a shield door (39) closes, thereby maintaining the inside of the processing area (1) to be airtight with respect to the exterior. The treated part of the wafer is removed from the entrance and exit area (1a), after which it is again stored in the cassette by following the order of procedure opposite that described above.

A specific example of the shielding plate will now be described. All of the following examples relates to a shielding plate designed for a 4.5 inch wafer.

Figure 1:
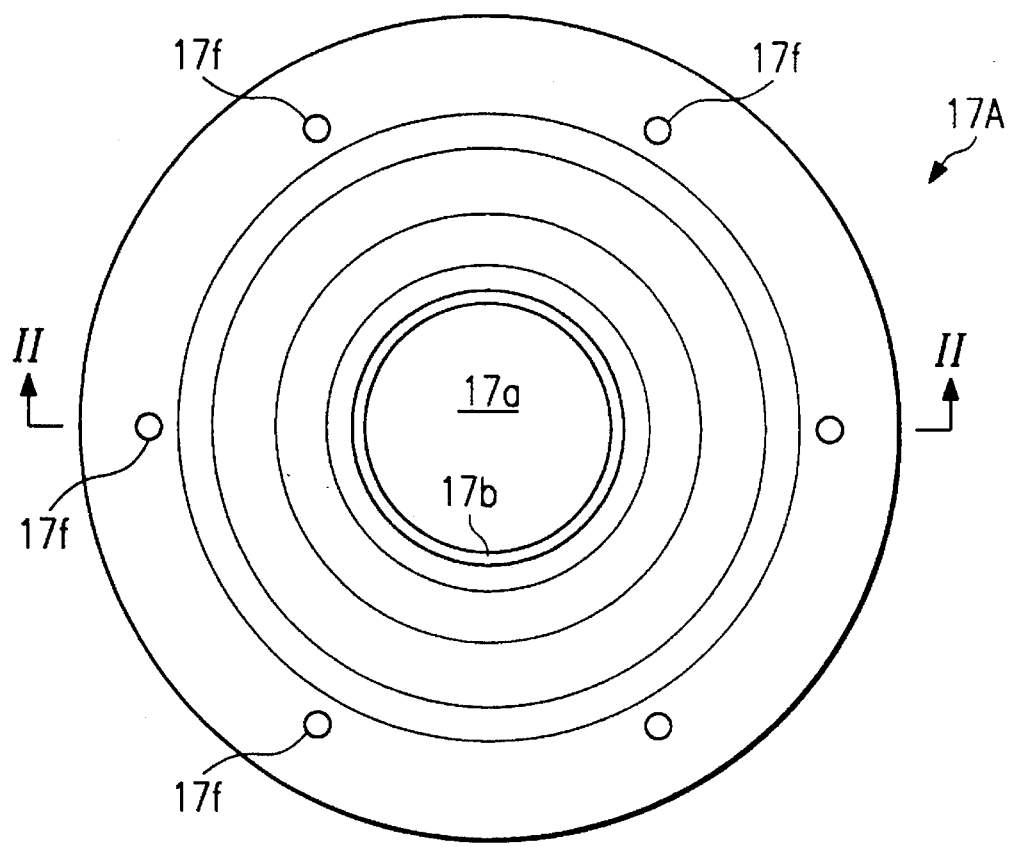
FIG. 1 is a plan view of one embodiment of a shielding plate as provided in a processing system in accordance with the present invention.
Figure 2:
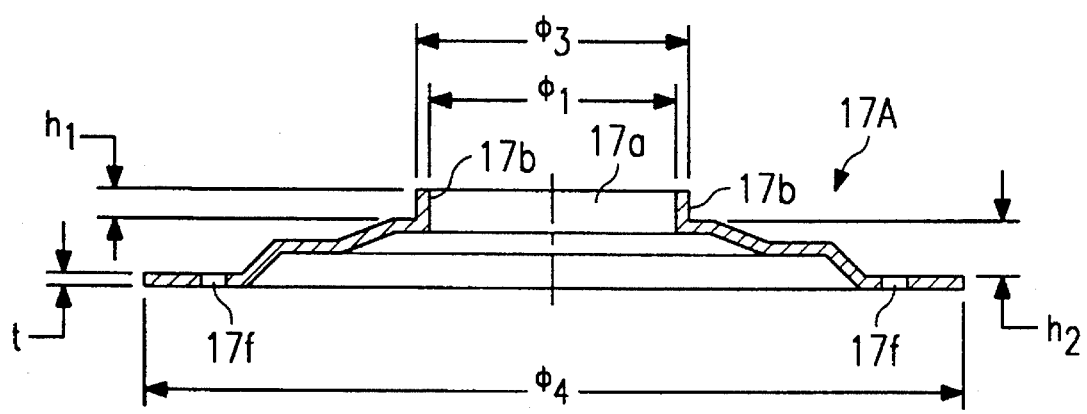
FIG. 2 is a cross-sectional view of the shielding plate shown in FIG. 1, as taken along the line II—II of FIG. 1.

FIG. 1 is a plan view of a shielding plate (a side view seen from the left side of FIG. 17), and FIG. 2 is a cross section of the line II—II in FIG. 1.

The shielding plate (17A) is a disc made of aluminum or stainless steel, having a thickness t of 0.8 mm, external diameter $\phi_4$ of 233.7 mm, and roughened on both sides by blast finishing. It is bent diagonally upward and inward at four locations, and a cylindrical member (17b) is formed near its center, inside of which cylindrical member (17b) is formed a through-hole (17a). The inner diameter $\phi_1$ of the cylindrical member (17b) is 122 mm and its height $h_1$ is 6 mm. The height $h_2$ of the innermost plate with respect to the outermost plate is 15.2 mm. Through-holes (17f) with inner diameters of 5.5 mm are formed in a number of locations (six locations in the present example) at equidistant intervals in the circumferential direction on the outermost plate to attach the pressure plate ((16) as shown in FIG. 17).

Figure 3:
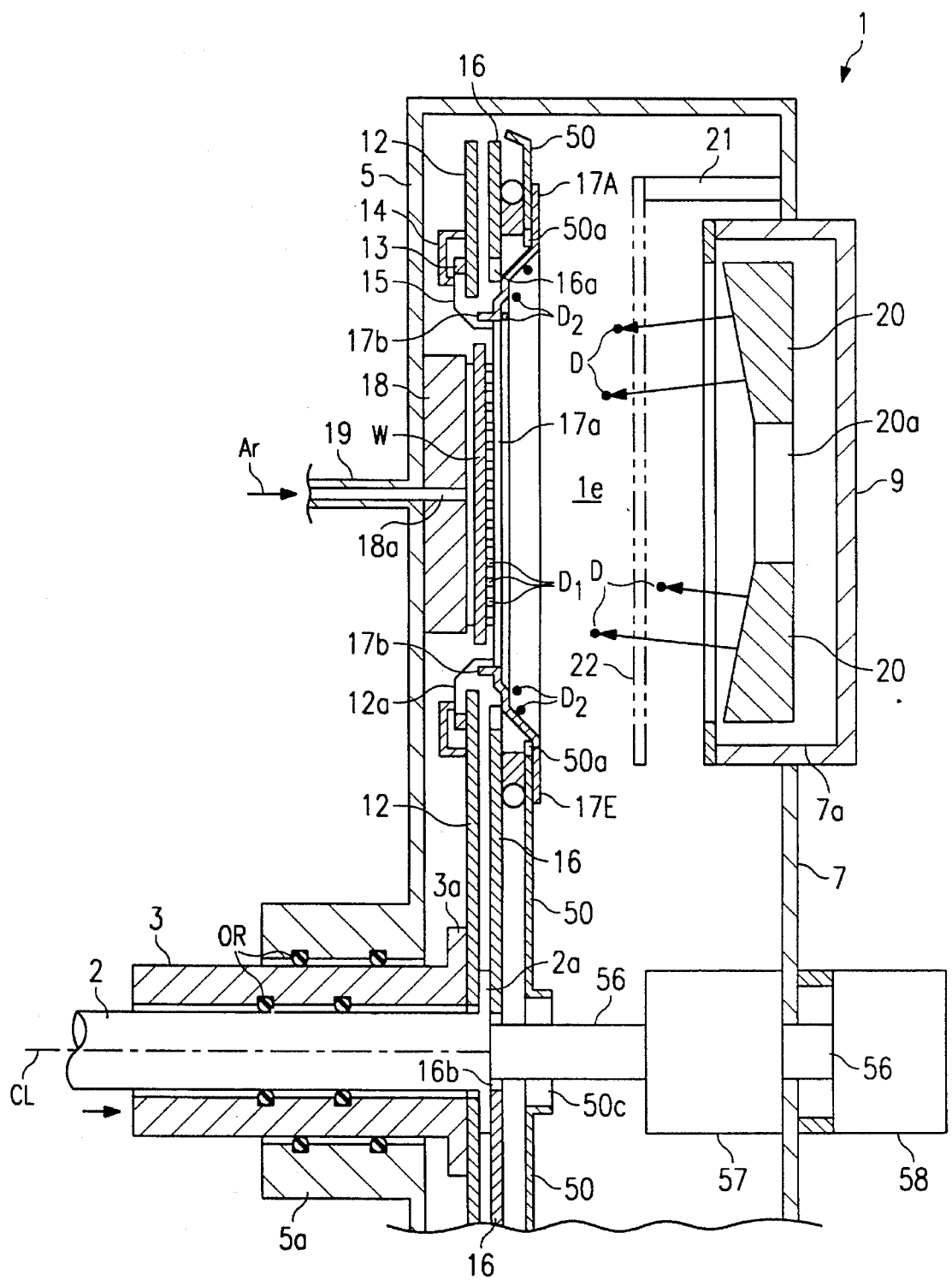
FIG. 3 is a cross-sectional view of a sputtering system which includes the shielding plate of FIGS. 1 and 2.
Figure 17:
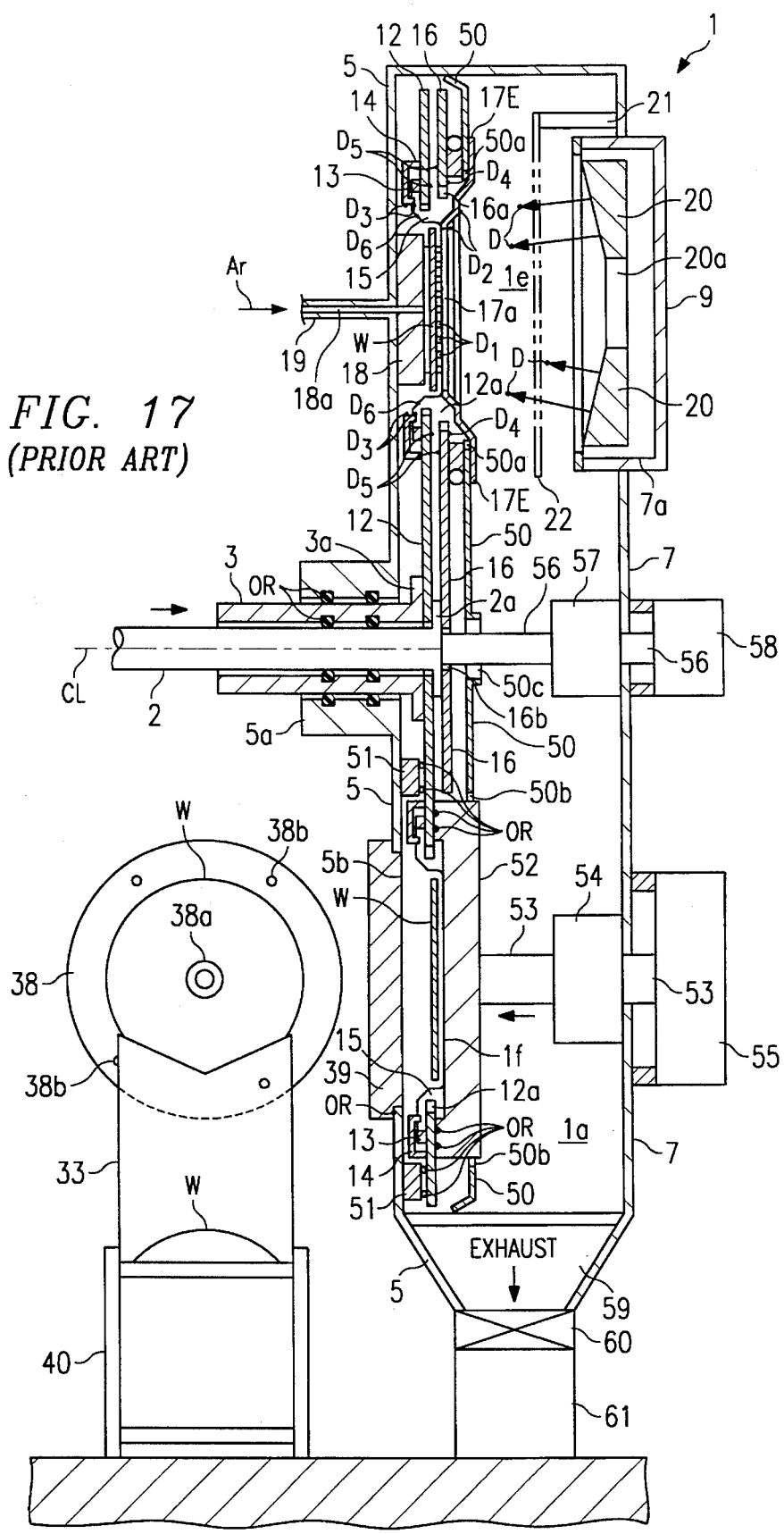
FIG. 17 is a cross-sectional view of a conventional sputtering system and showing the sputtering treatment area.
Figure 18:
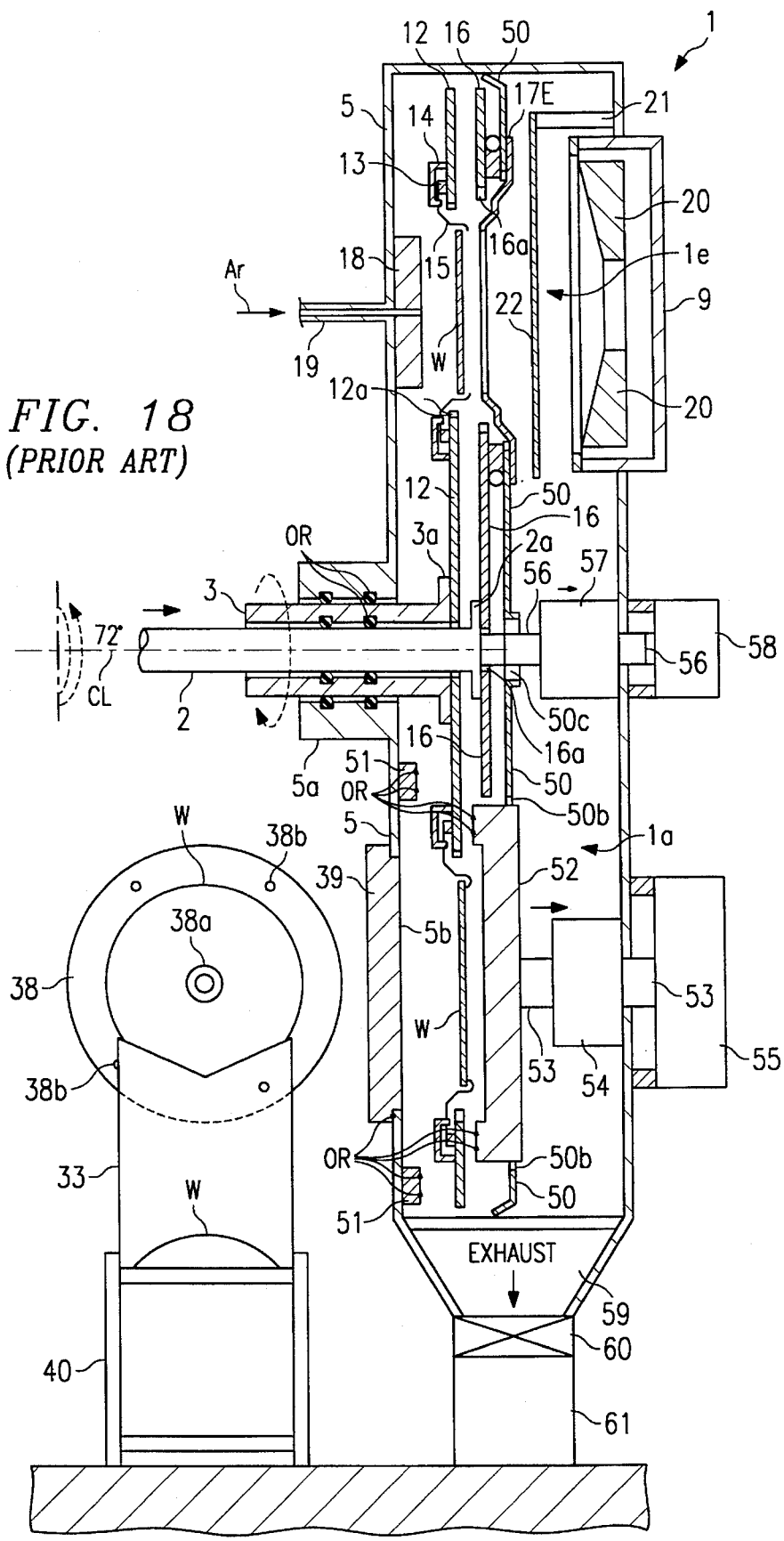
FIG. 18 is a cross-sectional view of the conventional sputtering System shown in FIG. 17, but illustrating semiconductor wafer movement during a stage of the sputtering processing.

FIG. 3 is a schematic cross section similar to FIG. 17 (except that it concerns the third sputtering area 1e only) which shows sputtering being carried out on the wafer using the shielding plate (17A) shown in FIGS. 1 and 2 inside the third sputtering area (1e) of the processing area (1). It should be noted that identical numbers refer to the same components as in FIG. 17, which will not be described.

The cylindrical member (17b) of the shielding plate (17A) is inserted between the through-holes of the transfer plate (12) and pressure plate (16), and between the clip covers (14) and (14), to surround the wafer W inside the through-hole (17a). It is used to completely shield these components from the aluminum atoms D which are floated against them. The area outside the wafer W and shielding plate (17A) which is not shielded from the aluminum atoms consists only of the tips and sides of the clips (15). Thus, as the aluminum particles $D_1$ adhere to the wafer W and deposit on the surface of the wafer W, the amount of aluminum particles ($D_6$ in FIG. 17) adhering to the clips (15) will be small. Since the aluminum particles $D_2$ adhering to the shielding plate (17A) are deposited in the same manner as the aluminum particles $D_1$ on the wafer W to form an aluminum thin film, they do not separate from the shielding plate (17A). Since the two surfaces of the shielding plate (17A) have been roughened by a blast treatment as described above, the adhering particles are effectively prevented from separating. As a result, even if the aluminum particles $D_6$ separate from the clips (15) to adhere to the wafer W while the wafer is being moved, since the amount involved is very slight, there will be absolutely none of the aforementioned difficulties.

Figure 4:
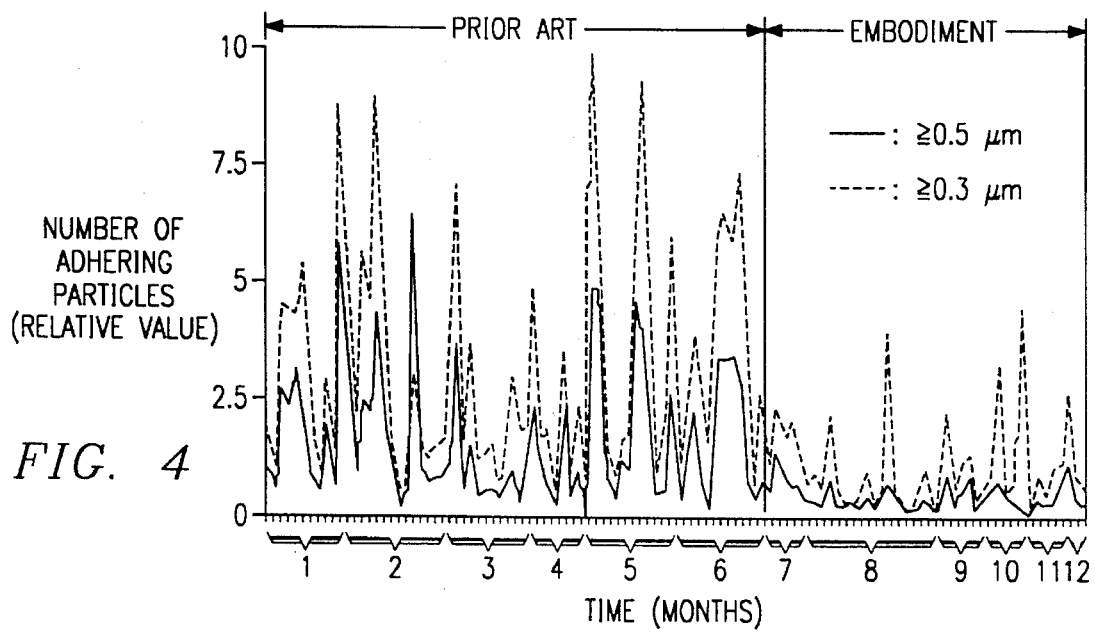
FIG. 4 is a graphical representation comparing a conventional sputtering system to the sputtering system shown in FIG. 3 as to the relative number of undesirable particles adhering to the semiconductor wafer in relation to comparable time increments.

FIG. 4 shows the trends found in a study conducted at regular intervals related to the number of undesired particles adhering to a single wafer during continued operation over eleven and one half months (aluminum particles which first adhered to areas other than the wafer, then separated to adhere to the wafer; carbon particles arising because of the minute amount of $CO_2$ in the atmosphere, etc.). In the figure, the shielding plate (17E) shown in FIG. 17 was used through the sixth month (the cylindrical member 17b was not used; through-hole diameter $\phi_3$ of 124 mm, and an $h_2$ dimension of 15.0 mm, on the imaginary line shown in FIG. 2), and the shielding plate (17A) shown in FIGS. 1 and 2 was used from the seventh month onward. In the FIG., "$\geq 0.5 \mu$" refers to the relative value of the number of undesired particles with a diameter of 0.5 μm or greater adhering to the wafer. This measurement was carried out using a commonly used device called a "laser surface tester". Although the adherence of minute particles having diameters of less than 0.5 μm creates almost no problem, the number of adhering particles with diameters of 0.3 μm or greater (including those with diameters of 0.5 μm or greater) is shown in FIG. 4 for reference.

During the period in which the conventional shielding plate (17E) was used, the average levels of adhering particles with diameters of 0.3 μm or greater and diameters of 0.5 μm or greater were 0.3 and 0.15, respectively. In contrast, during the period in which the shielding plate (17A) of the present example was used, the average levels of adhering particles with diameters of 0.3 μm or greater and diameters of 0.5 μm or greater were 0.09 and 0.03, respectively. Thus, the average levels of adhering particles were greatly reduced in comparison with the conventional example, to ⅓ for diameters of 0.3 μm or greater, and to ⅕ for diameters of 0.5 μm or greater.

The shielding plate (17A) and clips (15) are accurately attached to the designated locations in the processing area (1) in the following manner. First, a sleeve (not shown), the outer diameter of which is roughly equal to the inner diameter of the shielding plate, is placed over the heater (18) shown in FIG. 3, after which the shielding plate (17A) is fitted onto this sleeve to position (center) the shielding plate (17A), fastening it to the pressure plate (16). Next, the sleeve is withdrawn, after which the clips (15) are attached to the transfer plate (12). The cylindrical member (17b) of the shielding plate serves to make the aforementioned attachment to the sleeve extremely easy, in addition to preventing undesired particles from adhering to the wafer.

Figure 5:
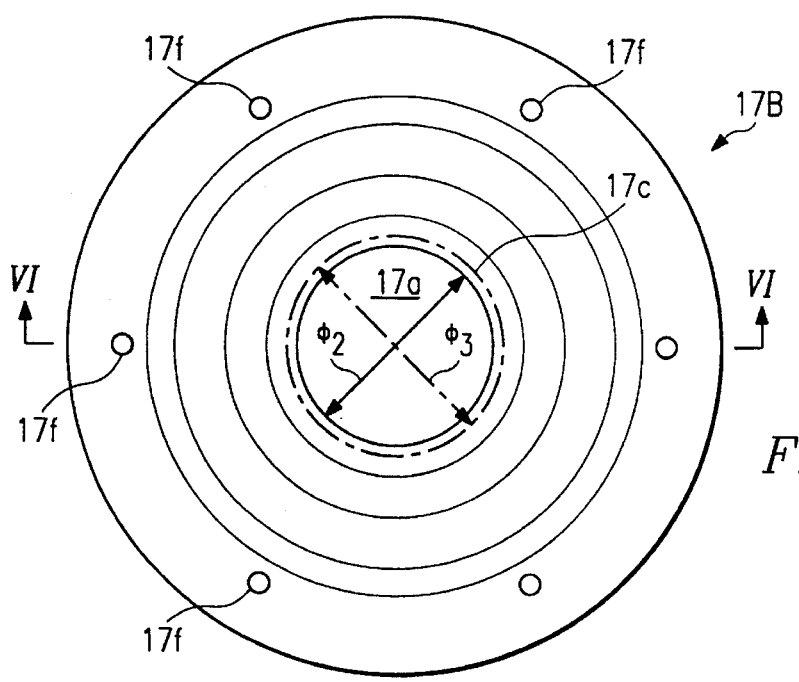
FIG. 5 is a plan view of another embodiment of a shielding plate.
Figure 6:
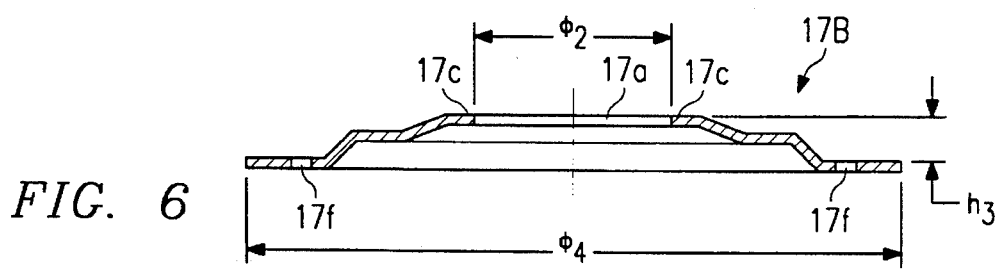
FIG. 6 is a cross-sectional view of the shielding plate shown in FIG. 5, as taken along the line VI—VI of FIG. 5.
Figure 7:
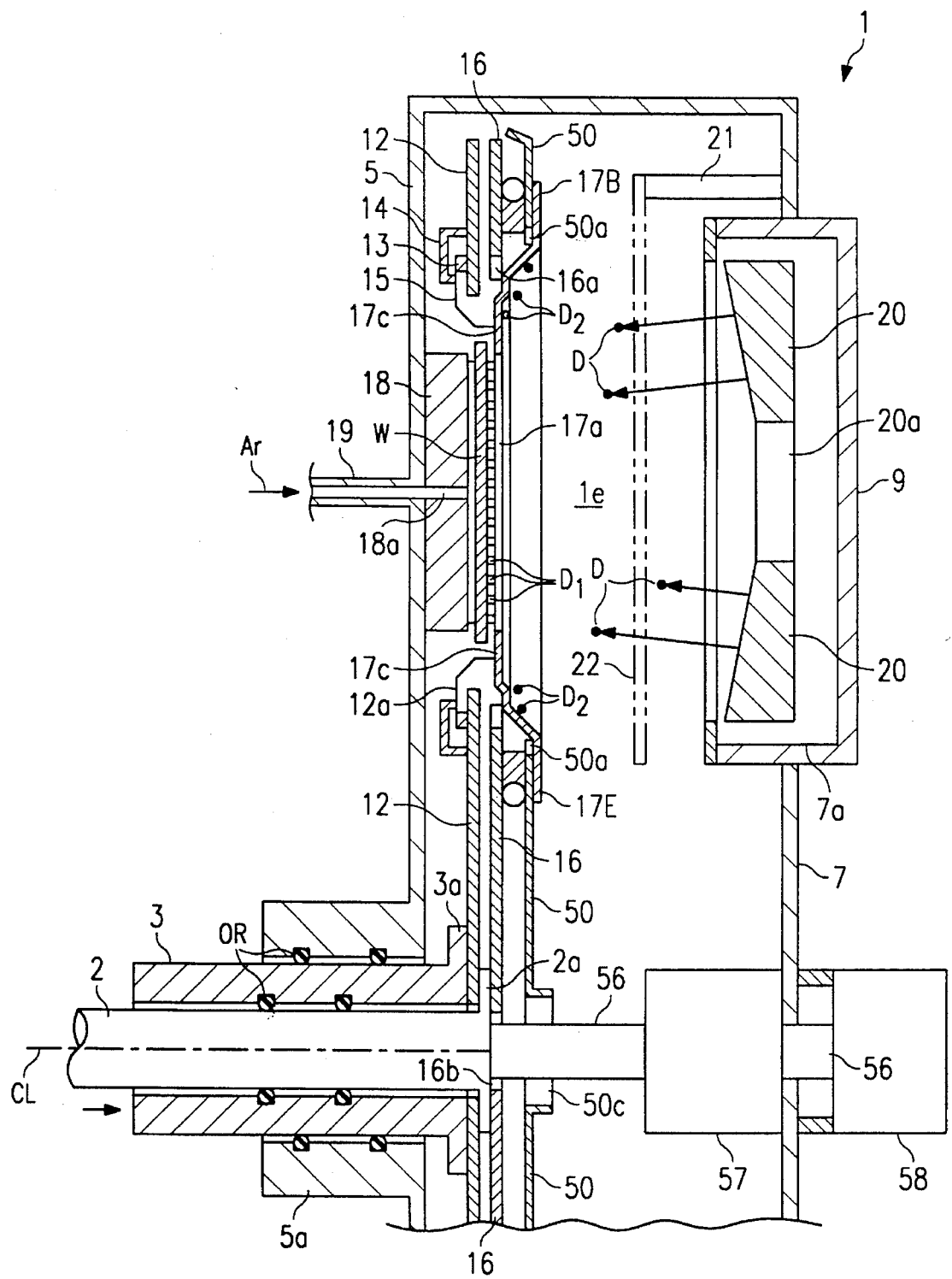
FIG. 7 is a cross-sectional view of a sputtering system similar to that shown in FIG. 3, but including the shielding plate of FIGS. 5 and 6.

FIG. 5 is a plan view of another shielding plate example which is similar FIG. 1. FIG. 6 is a cross section of the line VI—VI in FIG. 5. FIG. 7 is a schematic cross section which is similar to FIG. 3.

With this shielding plate (17B) example, a cylindrical member is not used. The inner diameter $\phi_2$ of the through-hole (17a) and outer diameter of the wafer W are set to be smaller than 95 mm and 114.3 mm (25.4 mm×4.5), respectively. FIG. 5 shows the outer diameter of the wafer as an imaginary line, which outer diameter is denoted as $\phi_3$. Since the inner diameter of the through-hole (17a) in the shielding plate (17B) is made smaller than the outer diameter of the wafer, the clips (15) are also shielded by a ring member (17c), which is within the outer diameter of the wafer. In this case, although no undesired particles adhere to the wafer, the film is not thick enough on the perimeter of the wafer, which results in irregular products in approximately 30% of the final products. However, if a shielding plate having the shape shown in FIGS. 5 and 6 is used for wafers with larger diameters, such as six inches or eight inches, then the percentage of defect is greatly reduced. In addition, it is also effective to use the shielding plate (17B) shown in FIGS. 5 and 6 in cases where the thin film to be formed is not aluminum, but a tungsten-silicon base (such as $WSi_2$), in which it is desirable to further reduce the adherence of undesired particles, even if the effective surface area of the wafer is slightly reduced.

In such cases, the $h_3$ dimension (corresponding to the $h_2$ dimension in FIG. 2) of the shielding plate (17B) in FIG. 6 is set to 13.0 mm, to be smaller than the 15.0 mm of the conventional shielding plate (17E). The reason for this is as follows. Conventionally, the wafer and the area near the through-hole of the shielding plate have been close to each other. Thus, when the inner diameter of the through-hole is reduced, as in the shielding plate (17B), the distance of the two areas is close than that of prior during sputtering treatment, there is the possibility that the two areas may come into contact with each other. If the wafer W and shielding plate (17B) contact each other, it is easy for dust to accumulate. When this dust adheres to the wafer, the quality of the wafer is markedly reduced. In light of this condition, $h_3$ is set to 13.0 mm in the present example.

Figure 8:
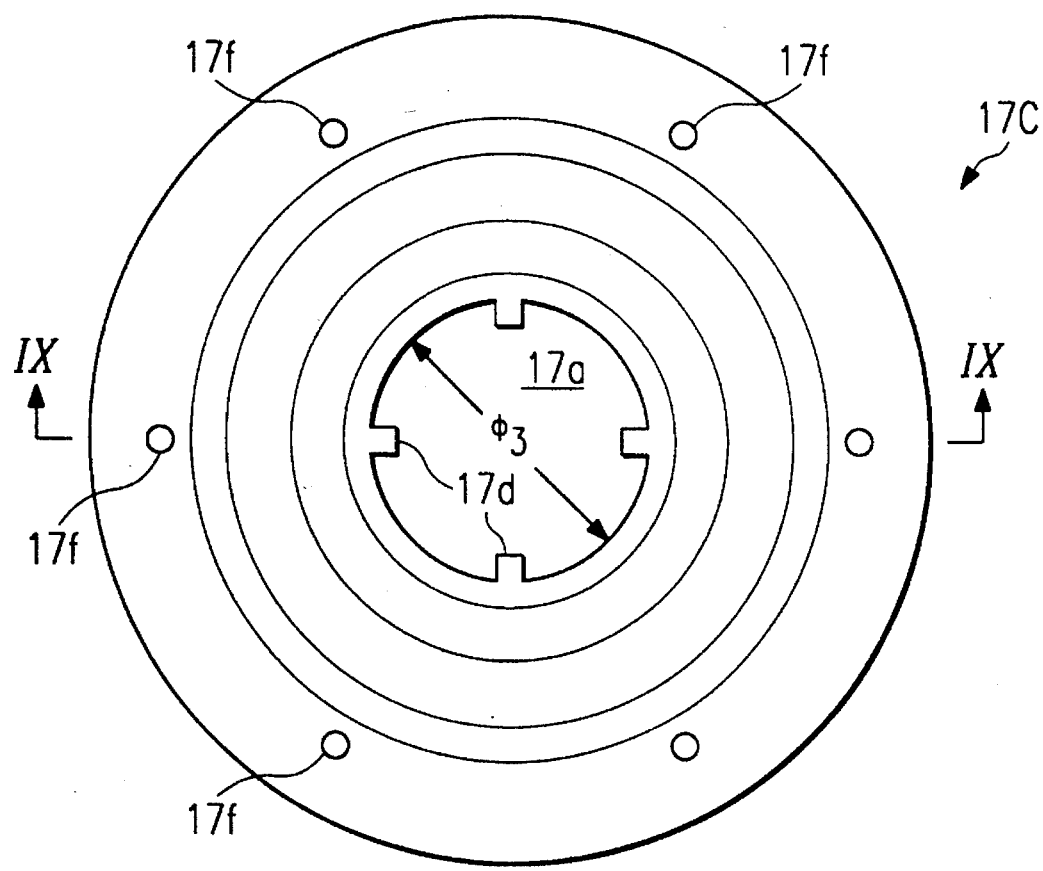
FIG. 8 is a plan view of another embodiment of a shielding plate.
Figure 9:
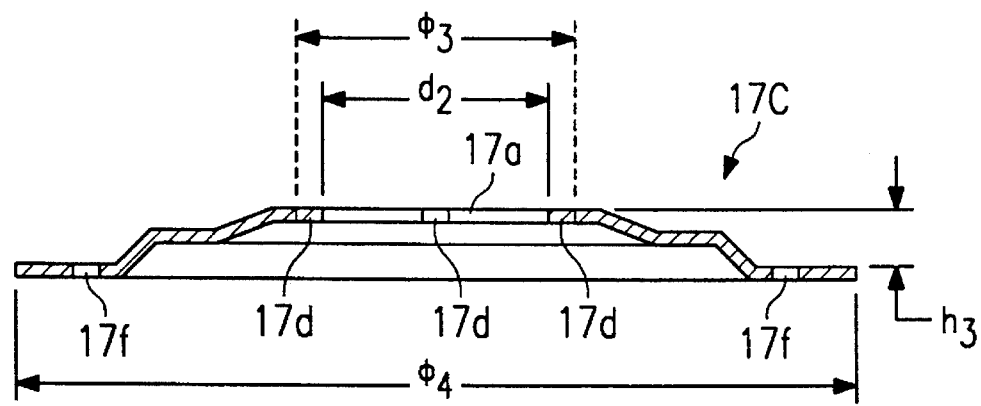
FIG. 9 is a cross-sectional view of the shielding plate of FIG. 8, as taken along the line IX—IX of FIG. 8.
Figure 10:
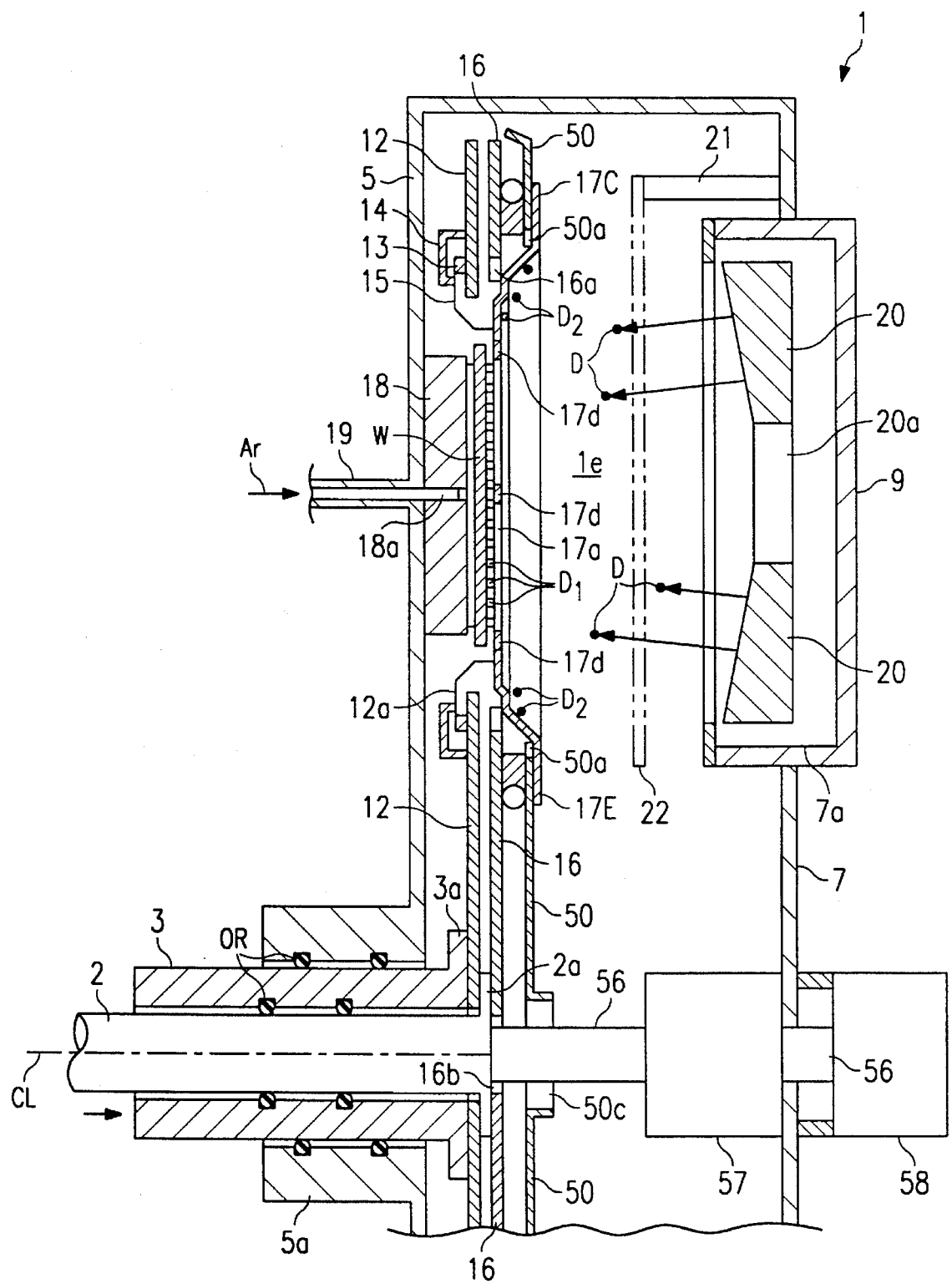
FIG. 10 is a cross-sectional view of a sputtering system similar to that shown in FIGS. 3 and 7, but including the shielding plate of FIGS. 8 and 9.

FIG. 8 is a plan view of yet another shield blocking plate example which is similar to FIGS. 1 and 5. FIG. 9 is a cross section of the line IX—IX in FIG. 8. FIG. 10 is a schematic cross section which is similar to FIGS. 3 and 7.

With this shielding plate example (17C), the inner diameter of the through-hole (17a) is set to the same $\phi_3$ as the outer diameter of the wafer. In place of the ring member (17c) within the outer diameter of the wafer in FIGS. 5 and 6, projections (17d), (17d), (17d), and (17d) are used which protrude inward according to the positions of the clips. The space d2 between the opposing protrusions (17d) and (17d) is set to 95 mm, which is the same as the inner diameter $\phi_2$ in FIGS. 5 and 6.

In the embodiment, there is a slight increase, in comparison with the shielding plate (17B) shown in FIGS. 5 and 6, in the amount of atoms entering the pressure plate, clips and transfer plate. However, there are only four areas, which correspond to the four protrusions (17d), in which the film is not thick enough in the thin film formed on the wafer. Thus, final product yield is improved (approximately 10% defect). The aforementioned areas on the wafer in which the film is not thick enough decrease in surface area as the diameter of the wafer is increased, which of course further improves yield.

Figure 11:
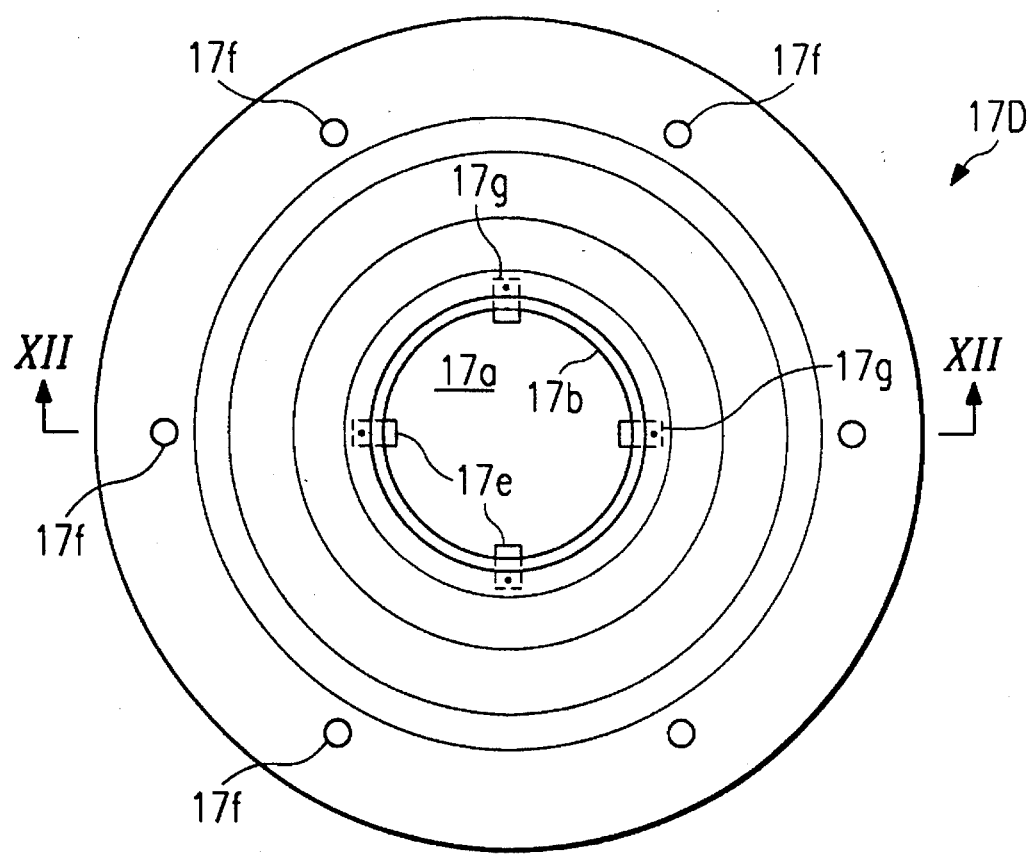
FIG. 11 is a plan view of another embodiment of a shielding plate.
Figure 12:
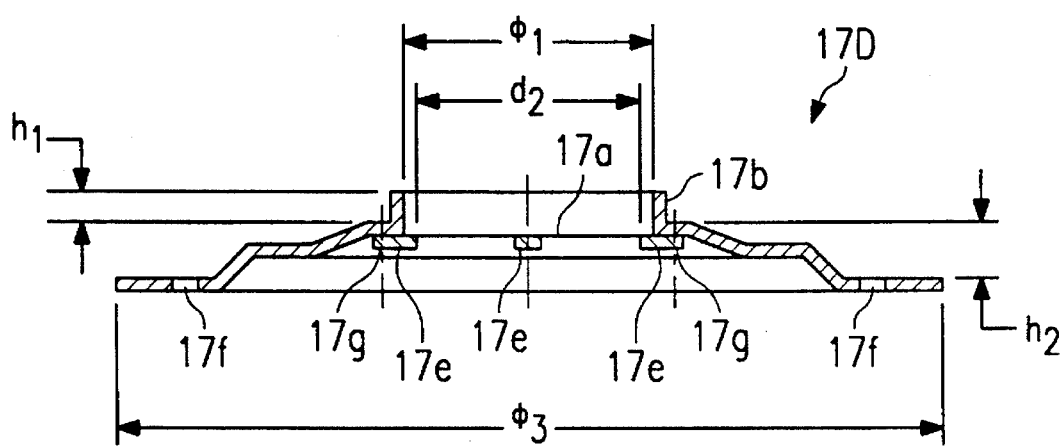
FIG. 12 is a cross-sectional view of the shielding plate shown in FIG. 11, as taken along the line XII—XII of FIG. 11.
Figure 13:
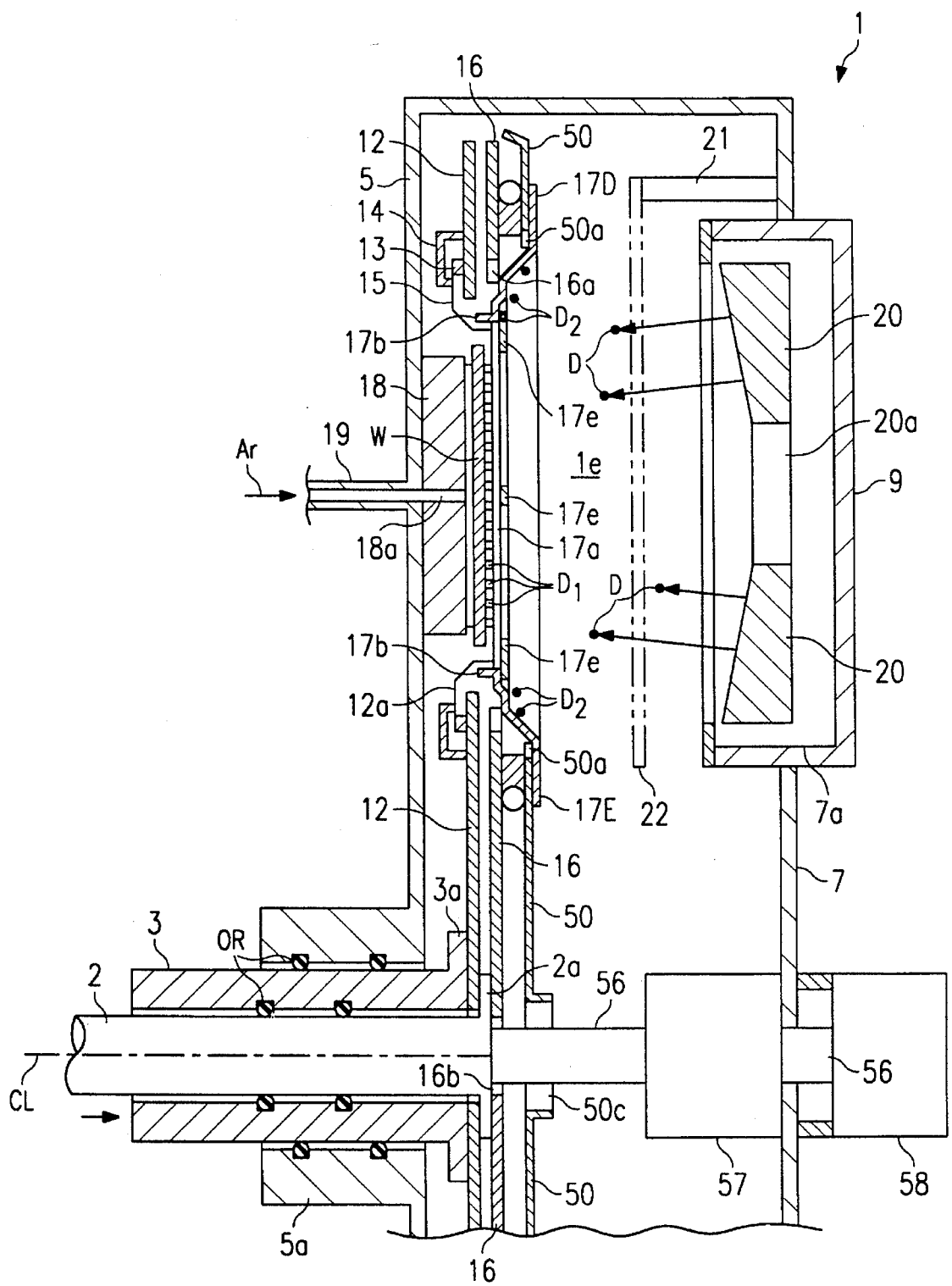
FIG. 13 is a cross-sectional view of a sputtering system similar to that shown in FIGS. 3, 7 and 10, but including the shielding plate of FIGS. 11 and 12.

FIG. 11 is a plan view of yet another example of a shielding plate which is similar to FIGS. 1 and 8. FIG. 12 is a cross section of the line XII—XII in FIG. 11. FIG. 13 is a schematic cross section which is similar to FIGS. 3 and 10.

A shielding plate (17D) is manufactured by adding the aforementioned protrusions (17d), (17d), (17d), and (17d) of the shielding plate (17C) to the aforementioned shielding plate (17A). However, with the shielding plate (17D), it was not possible to extend the protrusions (17d) since it contains a cylindrical member (17b) which is the same as the cylindrical member of the shielding plate (17A). Thus, in place of the protrusions (17d), plate-shaped chips (17e) were fastened to the back side of the shielding plate (17D) with rivets (17g), and the tips of the plate-shaped chips (17e) were allowed to protrude through the through-hole (17a). The distance between opposing plate-shaped chips (17e) and (17e) was set to $d_2$, which is the same as the distance between the protrusions (17d) and (17d) in FIGS. 8 and 9.

With the shielding plate (17D), in addition to the aforementioned effects of the shielding plate (17A) shown in FIGS. 1 and 2, there was the additional effect of the shielding plate (17C) of FIGS. 8 and 9, described above. Thus, the amount of undesired particles adhering to the wafer was further reduced.

In comparison with the conventional shielding plate (17E), if it is assumed that the use of shielding plate (17A) provides an effectiveness of 70%, then the use of shielding plate (17C) has an effectiveness of 30%, and the use of the shielding plate (17D) has an effectiveness of 80%.

With both of the shielding plates (17C) and (17D), there are areas in which the film is not thick enough on the wafer in the areas corresponding to through-holes (17a) of the protrusions (17d) and plate-shaped chip (17e). Thus, with aluminum sputtering, the production of the wiring pattern by etching is affected, which results in a defective rate in the range of 10% in the final products. The following countermeasure should be used when these shielding plates are employed. Specifically, when the sputtering material is aluminum or aluminum and silicon, since the amount of undesired particles adhering to the wafer is relatively low, shielding plate (17A) is sufficient. On occasion, it is also possible to use shielding plate (17C) (such as when the wafer has a large diameter). When the sputtering material is a metal with a high melting point, such as titanium, titanium-tungsten base, or tungsten-silicon base, thus generating a large amount of undesired particles, it is best to use shielding plate (17D). This is due to the fact that when sputtering is carried out with metals with a high melting point, such as those described above, it is easy for the adhering particles to be removed from the material to which they adhere due to stress distortion, even if no vibrations occur during movement.

Embodiments of the present invention were described above. However, it is also possible to apply a variety of alterations to the aforementioned embodiments, based on the technological ideas of the present invention. For example, it is possible to use other suitable structures for the structure of the sputtering systems shown in FIGS. 14–16. In addition to transfer types, in which a target semiconductor, such as a wafer, is rotated and moved to carry out the sputtering processing, it is also possible to apply the present invention to processing involving types in which the semiconductor is moved by an arm, or batch types, in which the semiconductor is not moved. In addition, it is also possible to apply the present invention to treatments other than sputtering, such as vapor deposition, and it is possible to use a variety of materials other than those described above for the film formation materials.

The present invention contains a shielding means for shielding, from the floated coating material particles, at least the greater part of the area consisting of the supporting means and the fastening means, which shielding means contains a shielding supplementary member, which is used to shield, from said coating material particles, areas other than the greater part of the area consisting of either said supporting means or said fastening means, or consisting of both of them. Thus, the amount of undesired coating formation particles which adheres to areas other than the semiconductor and shielding means is greatly reduced by the presence of said shielding supplementary member. Thus, these undesired coating material particles are effectively prevented from detaching from said areas during the coating process and/or after the coating process, adhering to the semiconductor, and adversely affecting the coating. As a result, the quality of the final product is guaranteed, and yield is also improved.

What is claimed is:

1. A processing system for depositing particles of a coating-formation material onto a surface of a semiconductor substrate in forming a coating of the coating material on the surface of the semiconductor substrate, said processing system comprising:

a housing having a vacuum chamber provided therein;

a source for providing coating-formation material particles within the vacuum chamber;

a transfer plate disposed in the vacuum chamber and facing a first side wall of said housing;

a pressure plate disposed in the vacuum chamber in substantially parallel spaced relation to said transfer plate;

an annular shielding plate mounted within said vacuum chamber and being disposed on said pressure plate, said annular shielding plate including an inner shielding portion having a central opening in which the semiconductor substrate is adapted to be disposed, the diameter of the central opening in said inner shielding portion being substantially equal to the outer diameter of the semiconductor substrate, the inner shielding portion further including a plurality of radially inwardly extending spaced projections, said plurality of projections being arranged in opposing pairs of projections, and the distance between each pair of opposing projections being less than the outer diameter of the semiconductor substrate, an intermediate shielding portion extending radially outwardly with respect to said inner shielding portion in axially offset relation with respect thereto, a first angular shielding portion extending between the outer periphery of said inner shielding portion and the inner periphery of said intermediate shielding portion and integrally connecting said inner shielding portion and said intermediate shielding portion, an outer shielding portion extending radially outwardly with respect to said intermediate shielding portion in axially offset relation with respect thereto, and a second angular shielding portion extending between the outer periphery of said intermediate shielding portion and the inner periphery of said outer shielding portion and integrally connecting said intermediate shielding portion and said outer shielding portion;

means securing said outer shielding portion of said annular shielding plate to said pressure plate; and means for moving said pressure plate toward said transfer plate and into engagement therewith to enable location of the semiconductor substrate disposed in the central opening of said inner shielding portion of said annular shielding plate within the vacuum chamber for exposure to the particles of the coating-formation material within the vacuum chamber as provided by the source of the coating-formation material particles.

2. A processing system for depositing particles of a coating-formation material onto a surface of a semiconductor substrate in forming a coating of the coating material on the surface of the semiconductor substrate, said processing system comprising:

a housing having a vacuum chamber provided therein;

a source for providing coating-formation material particles within the vacuum chamber;

a transfer plate disposed in the vacuum chamber and facing a first side wall of said housing;

a pressure plate disposed in the vacuum chamber in substantially parallel spaced relation to said transfer plate;

an annular shielding plate mounted within said vacuum chamber and being disposed on said pressure plate, said annular shielding plate including an inner shielding portion in the form of a cylindrical hub having a central opening therethrough in which the semiconductor substrate is adapted to be disposed, the cylindrical hub extending axially in the direction of said pressure plate and said transfer plate and adapted to surround the outer periphery of said semiconductor substrate in spaced relationship thereto to shield said pressure plate and said transfer plate from the deposition particles of the coating-formation material within the vacuum chamber, a plurality of chips secured to said inner cylindrical hub on the side thereof opposite from said pressure plate and extending radially inwardly within the central opening through said cylindrical hub and defining projections arranged in opposing pairs of projections, and the distance between each pair of opposing projections being less than the outer diameter of the semiconductor substrate, an intermediate shielding portion extending radially outwardly with respect to said cylindrical hub defining said inner shielding portion in axially offset relation with respect thereto, a first angular shielding portion extending between the outer periphery of said cylindrical hub defining said inner shielding portion and the inner periphery of said intermediate shielding portion and integrally connecting said cylindrical hub defining said inner shielding portion and said intermediate shielding portion, an outer shielding portion extending radially outwardly with respect to said intermediate shielding portion in axially offset relation with respect thereto, and a second angular shielding portion extending between the outer periphery of said intermediate shielding portion and the inner periphery of said outer shielding portion and integrally connecting said intermediate shielding portion and said outer shielding portion;

means securing said outer shielding portion of said annular shielding plate to said pressure plate; and means for moving said pressure plate toward said transfer plate and into engagement therewith to enable location of the semiconductor substrate disposed in the central opening of said cylindrical hub defining said inner shielding portion of said annular shielding plate within the vacuum chamber for exposure to the particles of the coating-formation material within the vacuum chamber as provided by the source of the coating-formation material particles.

3. A processing system for depositing particles of a coating-formation material emitted from a target of the coating material onto a surface of a semiconductor substrate in forming a coating of the coating material on the surface of the semiconductor substrate, said processing system comprising:

a housing having a vacuum chamber provided therein;

a target of the coating material mounted in the vacuum chamber;

a shaft extending outwardly from a first side wall of said housing;

a hollow cylindrical shaft mounted on said shaft for rotation thereabout and extending outwardly from said first side wall of said housing;

a transfer plate disposed in the vacuum chamber and facing said first side wall of said housing, said transfer plate being secured to said hollow cylindrical shaft for rotation therewith;

a pressure plate disposed in the vacuum chamber in substantially parallel spaced relation to said transfer plate;

an annular shielding plate mounted within said vacuum chamber in registration with said target, said annular shielding plate being disposed on said pressure plate and including an inner shielding portion having a central opening in which the semiconductor substrate is adapted to be disposed, the diameter of the central opening in said inner shielding portion being substantially equal to the outer diameter of the semiconductor substrate, the inner shielding portion further including a plurality of radially inwardly extending spaced projections, said plurality of projections being arranged in opposing pairs of projections, and the distance between each pair of opposing projections being less than the outer diameter of the semiconductor substrate, an intermediate shielding portion extending radially outwardly with respect to said inner shielding portion in axially offset relation with respect thereto, a first angular shielding portion extending between the outer periphery of said inner shielding portion and the inner periphery of said intermediate shielding portion and integrally connecting said inner shielding portion and said intermediate shielding portion, an outer shielding portion extending radially outwardly with respect to said intermediate shielding portion in axially offset relation with respect thereto, and a second angular shielding portion extending between the outer periphery of said intermediate shielding portion and the inner periphery of said outer shielding portion and integrally connecting said intermediate shielding portion and said outer shielding portion;

means securing said outer shielding portion of said annular shielding plate to said pressure plate; and means for moving said pressure plate, said shaft, and said rotary hollow shaft axially in a direction toward said transfer plate so as to dispose said pressure plate in engagement with said transfer plate to enable location of the semiconductor substrate within the vacuum chamber in registration with said target.

4. A processing system for depositing particles of a coating-formation material emitted from a target of the coating material onto a surface of a semiconductor substrate in forming a coating of the coating material on the surface of the semiconductor substrate, said processing system comprising:

a housing having a vacuum chamber provided therein;

a target of the coating material mounted in the vacuum chamber;

a shaft extending outwardly from a first side wall of said housing;

a hollow cylindrical shaft mounted on said shaft for rotation thereabout and extending outwardly from said first side wall of said housing;

a transfer plate disposed in the vacuum chamber and facing said first side wall of said housing, said transfer plate being secured to said hollow cylindrical shaft for rotation therewith;

a pressure plate disposed in the vacuum chamber in substantially parallel spaced relation to said transfer plate;

an annular shielding plate mounted within said vacuum chamber in registration with said target, said annular shielding plate being disposed on said pressure plate and including an inner shielding portion in the form of a cylindrical hub having a central opening therethrough in which the semiconductor substrate is adapted to be disposed, the cylindrical hub extending axially in the direction of said pressure plate and said transfer plate and adapted to surround the outer periphery of said semiconductor substrate in spaced relationship thereto to shield said pressure plate and said transfer plate from the deposition particles of the coating-formation material within the vacuum chamber, a plurality of chips secured to said inner cylindrical hub on the side thereof opposite from said pressure plate and extending radially inwardly within the central opening through said cylindrical hub and defining projections arranged in opposing pairs of projections, and the distance between each pair of opposing projections being less than the outer diameter of the semiconductor substrate, an intermediate shielding portion extending radially outwardly with respect to said cylindrical hub defining said inner shielding portion in axially offset relation with respect thereto, a first angular shielding portion extending between the outer periphery of said cylindrical hub defining said inner shielding portion and the inner periphery of said intermediate shielding portion and integrally connecting said cylindrical hub defining said inner shielding portion and said intermediate shielding portion, an outer shielding portion extending radially outwardly with respect to said intermediate shielding portion in axially offset relation with respect thereto, and a second angular shielding portion extending between the outer periphery of said intermediate shielding portion and the inner periphery of said outer shielding portion and integrally connecting said intermediate shielding portion and said outer shielding portion;

means securing said outer shielding portion of said annular shielding plate to said pressure plate; and means for moving said pressure plate, said shaft, and said rotary hollow shaft axially in a direction toward said transfer plate so as to dispose said pressure plate in engagement with said transfer plate to enable location of the semiconductor substrate within the vacuum chamber in registration with said target.

* * * * *